(12) United States Patent
Takahashi et al.

(10) Patent No.: US 8,209,829 B2
(45) Date of Patent: Jul. 3, 2012

(54) METHOD OF FABRICATING THE ELECTRONIC DEVICE

(75) Inventors: Takeo Takahashi, Yokohama (JP); Xiaoyu Mi, Kawasaki (JP); Satoshi Ueda, Kawasaki (JP)

(73) Assignees: Taiyo Yuden Co., Ltd., Tokyo (JP); Fujitsu Limited, Kawasaki (JP)

( * ) Notice: Subject to any disclaimer, the term of this patent is extended or adjusted under 35 U.S.C. 154(b) by 466 days.

(21) Appl. No.: 12/394,995

(22) Filed: Feb. 27, 2009

(65) Prior Publication Data
US 2009/0219670 A1  Sep. 3, 2009

(30) Foreign Application Priority Data
Feb. 28, 2008  (JP) ................. 2008-048798

(51) Int. Cl.
*H01G 7/00* (2006.01)

(52) U.S. Cl. .............. 29/25.42; 29/25.03; 29/25.41; 29/830; 361/313

(58) Field of Classification Search ...... 29/25.35–25.42, 29/592.1, 830–832, 846, 847, 852; 361/306.3, 361/308.1, 313, 321.2, 762–763
See application file for complete search history.

(56) References Cited

U.S. PATENT DOCUMENTS

| | | | |
|---|---|---|---|
| 5,699,224 A * | 12/1997 | Hanamura et al. | 361/313 |
| 6,452,780 B2 * | 9/2002 | Kobayashi et al. | 361/308.1 |
| 7,052,823 B2 * | 5/2006 | Uda et al. | 430/312 |
| 7,498,727 B2 * | 3/2009 | Nakamura et al. | 310/366 |
| 7,866,028 B2 * | 1/2011 | Hiroshima et al. | 29/600 |
| 2002/0084736 A1 * | 7/2002 | Shibata | 313/310 |
| 2004/0190217 A1 | 9/2004 | Stokes | |
| 2006/0114077 A1 | 6/2006 | Mizuno et al. | |
| 2007/0045773 A1 | 3/2007 | Mi et al. | |

FOREIGN PATENT DOCUMENTS

| | | |
|---|---|---|
| JP | 06-283846 A | 10/1994 |
| JP | 10-098158 A | 4/1998 |
| JP | 2002-033559 A | 1/2002 |
| JP | 2004-304154 A | 10/2004 |
| JP | 2005-039070 A | 2/2005 |
| JP | 2005-093736 A | 4/2005 |
| JP | 2006-157738 A | 6/2006 |
| JP | 2007-031242 A | 2/2007 |
| JP | 2007-067236 A | 3/2007 |
| JP | 2007-123468 A | 5/2007 |
| WO | WO 01/11771 A1 | 2/2001 |

OTHER PUBLICATIONS

Japanese Patent Office Action for Application No. 2008-048798, dated Mar. 21, 2012.

* cited by examiner

*Primary Examiner* — Minh Trinh

(74) *Attorney, Agent, or Firm* — Arent Fox LLP

(57) ABSTRACT

A method of fabricating an electronic device includes selectively forming a glass layer on a ceramic substrate by printing, baking the glass layer, and forming a capacitor on the glass layer, the capacitor including metal electrodes and a dielectric layer interposed between the metal electrodes.

9 Claims, 16 Drawing Sheets

METHOD OF FABRICATING THE ELECTRONIC DEVICE

CROSS-REFERENCE TO RELATED APPLICATION

This application is based upon and claims the benefit of priority of the prior Japanese Patent Application No. 2008-048798, filed on Feb. 28, 2008, the entire contents of which are incorporated herein by reference.

FIELD

The present invention generally relates to electronic devices, and more particularly, to an electronic device having a ceramic substrate on which a capacitor is formed and a method for fabricating the same.

BACKGROUND

An RF (Radio Frequency) system such as a portable phone or a wireless LAN needs a phase adjustment for transmitting signals between devices. A passive element that may be an inductor and/or a capacitor is arranged at an input and/or output part of each device for the phase adjustment. These passive element may be formed as an IPD (Integrated Passive Device) in order to improve the integration density.

The IPD is required to be miniaturized and height-reduced in order to miniaturize and height-reduce the systems that use the IPD. There is a proposal that may meet the above requirements. According to this proposal, an IPD is formed on a main surface of a package substrate, and various types of electronic devices are mounted above the IPD.

Japanese Laid-Open Patent Publication Nos. 2006-157738 and 2007-67236 disclose techniques of forming a passive element on a ceramic substrate. Japanese Laid-Open Patent Publication Nos. 2007-31242 and 2007-123468 disclose techniques of forming a coating layer on a ceramic substrate.

The surfaces of the ceramic substrate have a great roughness, which affects the reliability of the passive elements mounted on the main surface of the ceramic substrate. In a case where an MIM (Metal-Insulator-Metal) type capacitor that is a structural element for IPD is formed on the surface of the ceramic substrate, if the adhesiveness between the lower electrode of the capacitor and the ceramic substrate is not good, the lower electrode made of a metal will be removed from the substrate at the time of annealing. When the surface of the substrate is not flat, the upper and lower metal electrodes of the capacitor may contact each other or the breakdown voltage may be reduced due to the thin dielectric film, whereby short-circuiting may take place.

The roughness of the surface of the ceramic substrate may be planarized by coating such as SOG (Spin On Glass). However, SOG does not resolve warpage of the whole ceramic substrate that takes place in baking, and does not improve the adhesiveness to the capacitor greatly. Warpage of the ceramic substrate may be removed by polishing the surface of the substrate. However, this needs an increased number of fabrication steps and increases the cost.

SUMMARY

According to an aspect of the present invention, there is provided a method of fabricating an electronic device, including: selectively forming a glass layer on a ceramic substrate by printing; baking the glass layer; and forming a capacitor on the glass layer, the capacitor including metal electrodes and a dielectric layer interposed between the metal electrodes.

According to another aspect of the present invention, there is provided an electronic device including: a ceramic substrate; a glass layer selectively formed on the ceramic substrate; and a capacitor formed on an upper surface of the glass layer, the capacitor including metal electrodes and a dielectric layer interposed between the metal electrodes, the glass layer being not formed in an area on the ceramic substrate in which the capacitor is not formed.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 1A and 1B illustrate a first part of a method of fabricating a ceramic multilayer substrate in accordance with a first embodiment, wherein FIGS. 1A and 1B are respectively top and cross-sectional views of the ceramic multilayer substrate;

FIGS. 2A and 2B illustrate a second part of the method, wherein FIGS. 2A and 2B are respectively top and cross-sectional views of the ceramic multilayer substrate;

FIGS. 3A and 3B illustrate a third part of the method, wherein FIGS. 3A and 3B are respectively top and cross-sectional views of the ceramic multilayer substrate;

FIGS. 4A and 4B illustrate a fourth part of the method, wherein FIGS. 4A and 4B are respectively top and cross-sectional views of the ceramic multilayer substrate;

FIGS. 5A and 5B illustrate a fifth part of the method, wherein FIGS. 5A and 5B are respectively top and cross-sectional views of the ceramic multilayer substrate;

FIGS. 6A and 6B illustrate a sixth part of the method, wherein FIGS. 6A and 6B are respectively top and cross-sectional views of the ceramic multilayer substrate;

FIGS. 7A and 7B illustrate a seventh part of the method, wherein FIGS. 7A and 7B are respectively top and cross-sectional views of the ceramic multilayer substrate;

DESCRIPTION OF EMBODIMENTS

A description will now be given of embodiments of the present invention with reference to the accompanying drawings.

First Embodiment

Figure 1A:
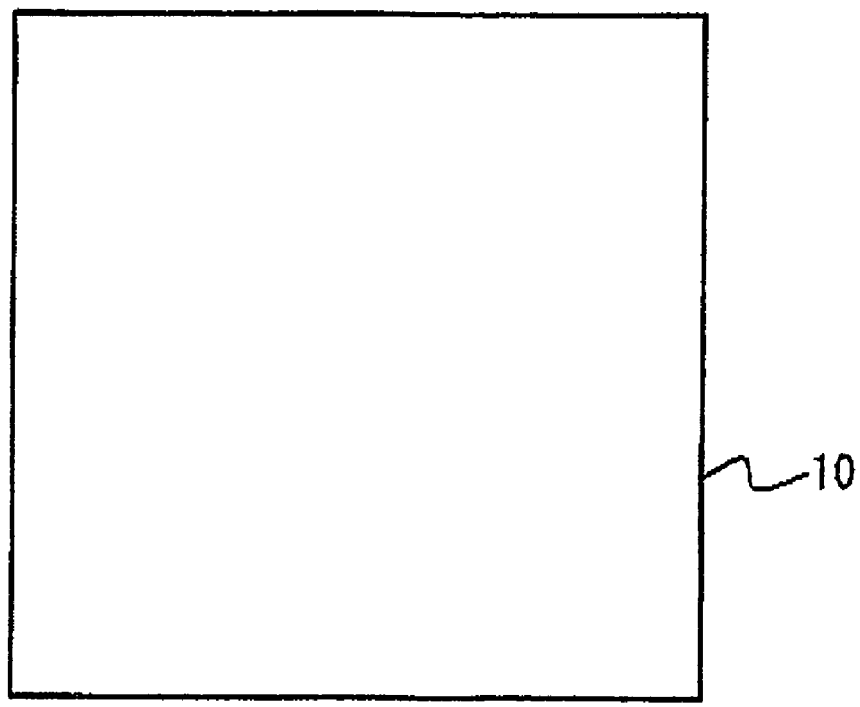
Figure 1B:

FIGS. 1A through 7B are respectively views illustrating a method of fabricating a ceramic substrate applied to an electronic device in accordance with a first embodiment. Referring to FIGS. 1A and 1B, a green sheet 10 of a predetermined size is formed by cutting a given sheet. The green sheet 10 may be made of a mixture of alumina ($Al_2O_3$) and glass ($SiO_2$). The green sheet 10 may be replaced by a metal oxide such as titanium oxide ($TiO_2$) or calcium oxide (CaO).

Figure 2A:
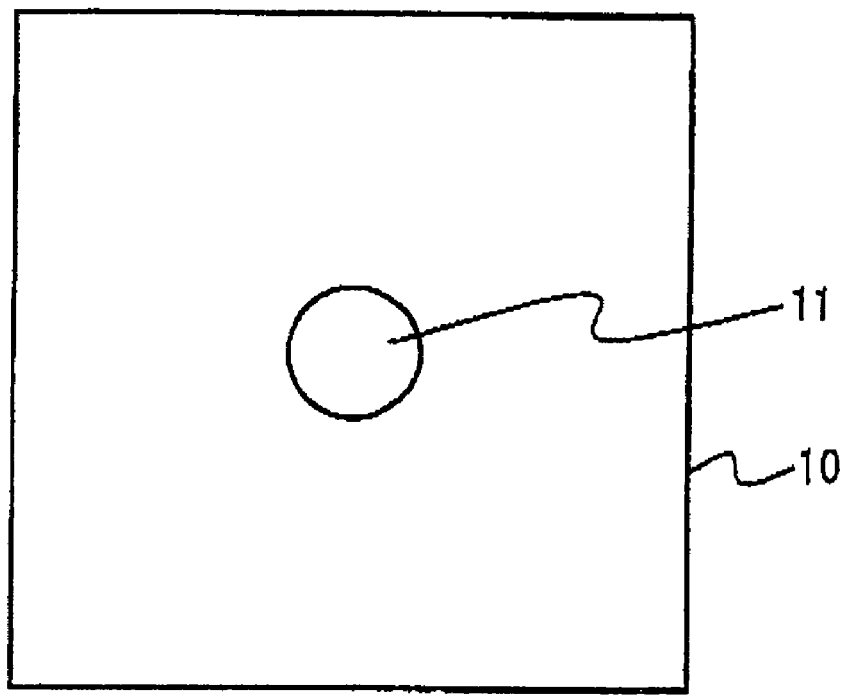
Figure 2B:
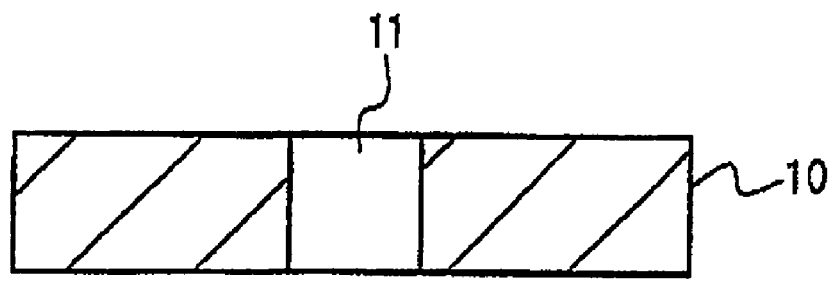
Figure 3A:
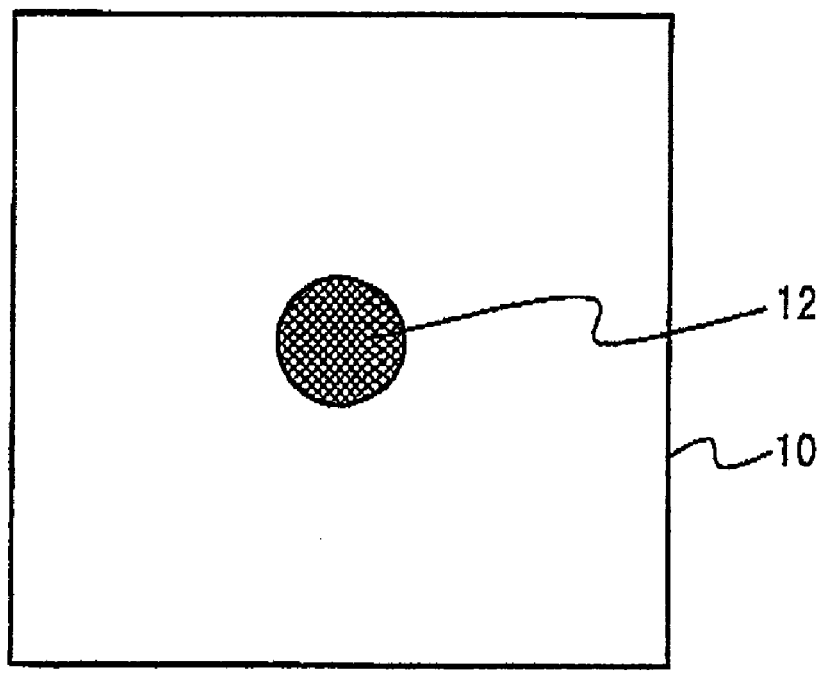
Figure 3B:
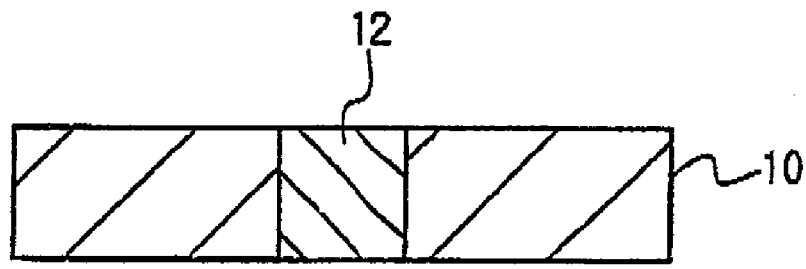
Figure 4A:
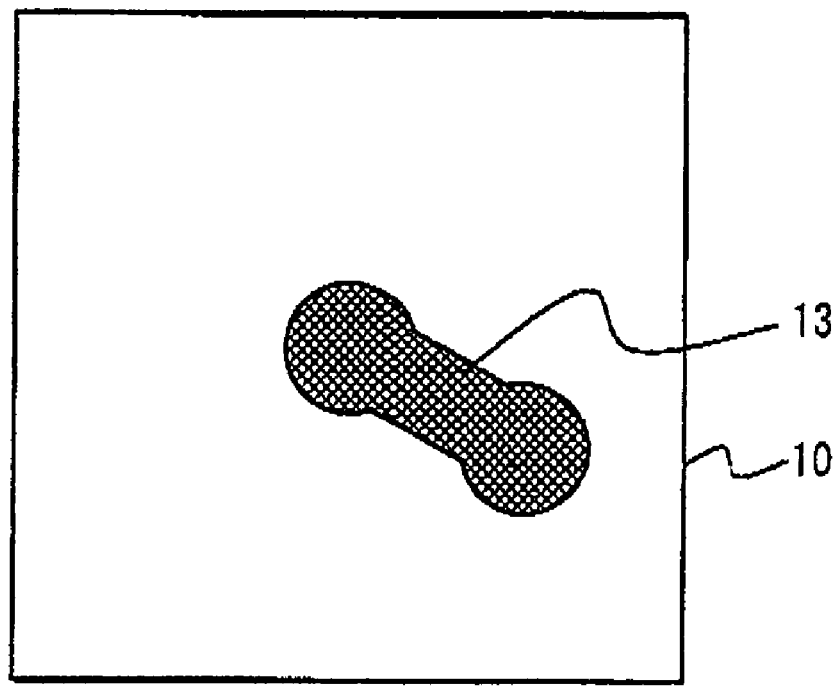
Figure 4B:
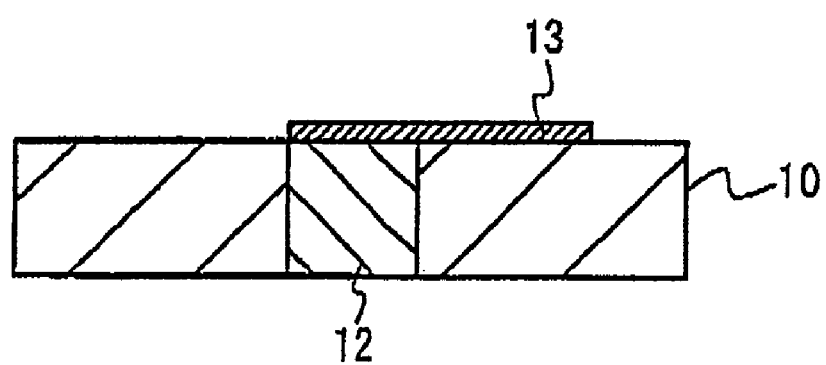

Referring to FIGS. 2A and 2B, the green sheet 10 is punched to form a through hole 11. Referring to FIGS. 3A and 3B, the through hole 11 is filled with a metal, so that a through electrode 12 can be formed. Referring to FIGS. 4A and 4B, a metal interconnection 13 is formed on the surface of the green sheet 10. The through electrode 12 and the metal interconnection 13 may be made of a metal, which may, for example, Ag, Au or Co.

Figure 5A:
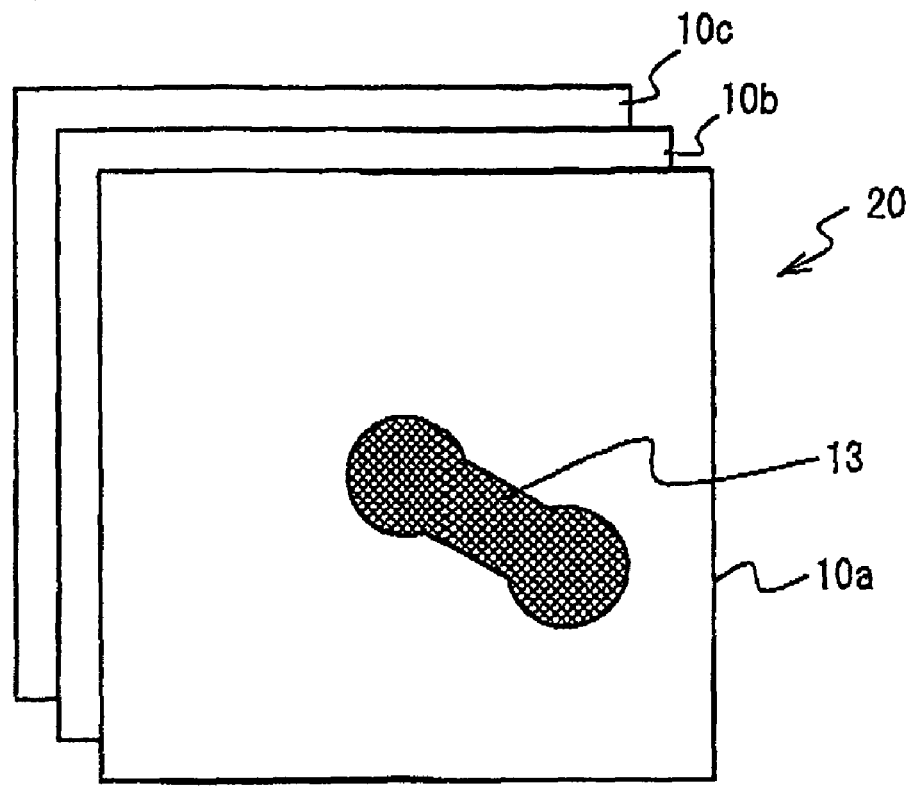
Figure 5B:
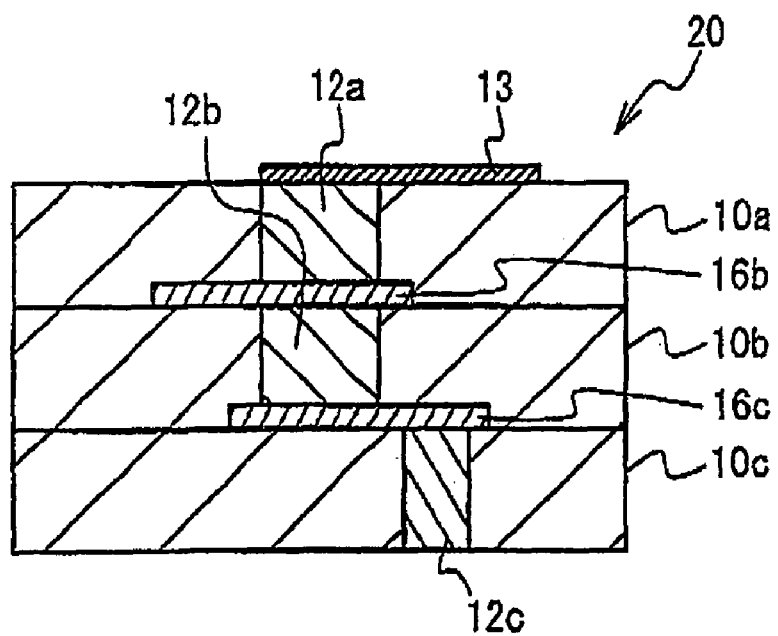
Figure 6A:
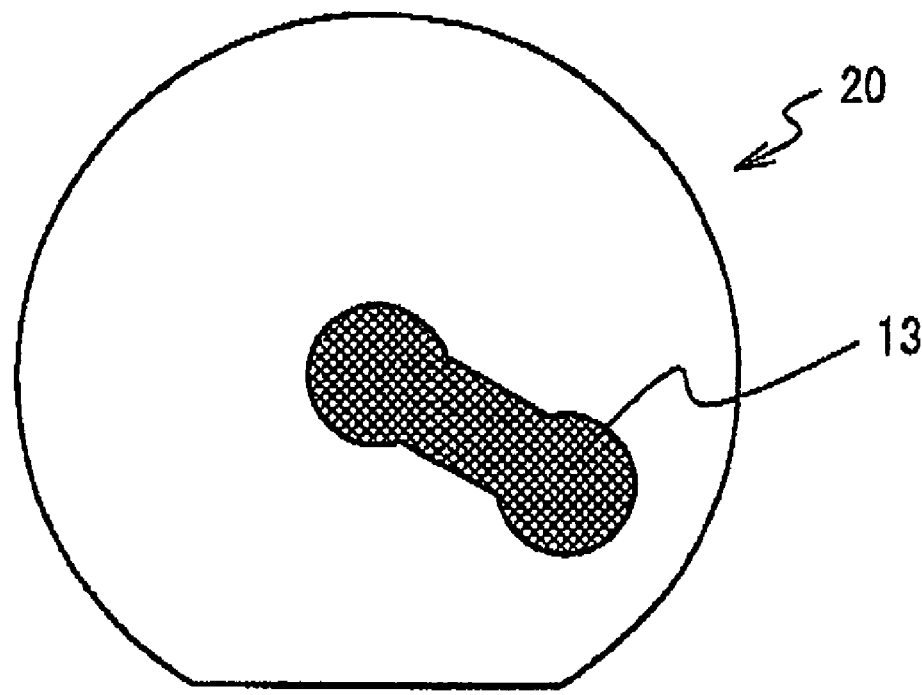
Figure 6B:
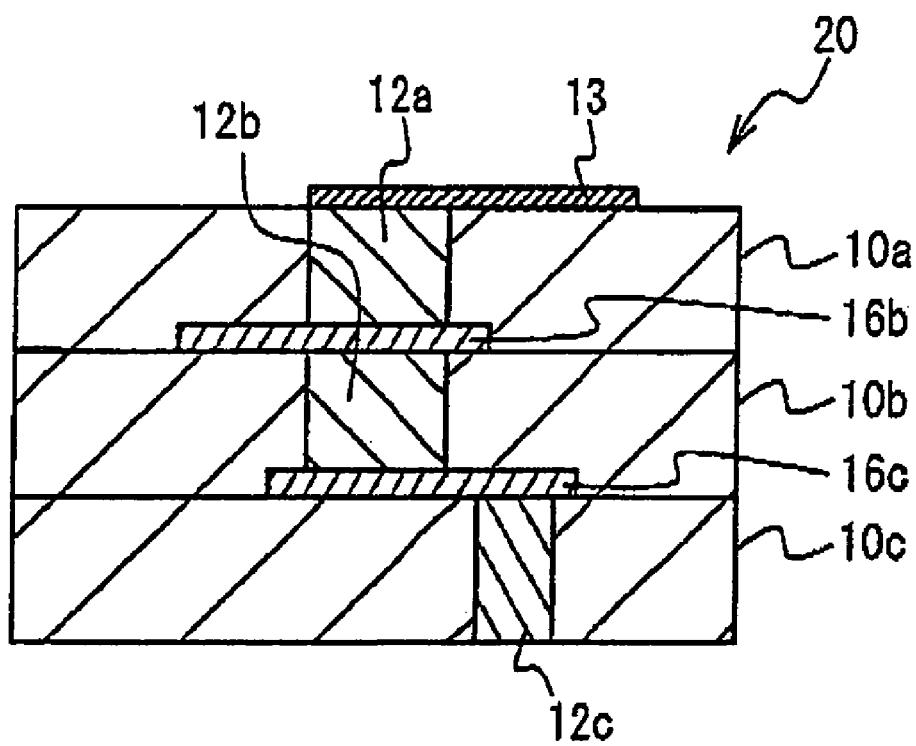

Referring to FIGS. 5A and 5B, multiple green sheets 10a through 10c each produced as described above are stacked to form a ceramic multilayer substrate 20. The multiple green sheets 10a through 10c are electrically connected to each other by the through electrodes 12 formed within the green sheets 10a through 10c and the metal interconnections 13 formed on the surfaces thereof. More specifically, referring to FIG. 5B, through electrodes 12a, 12b and 12c are electrically connected to each other by a surface interconnection 16b formed on the surface of the green sheet 10b, and a surface interconnection 16c formed on the surface of the green sheet 10c. Referring to FIGS. 6A and 6B, the stacked green sheets 10a through 10c are shaped into a given form. Shaping may be performed by hollowing up the green sheets 10a through 10c.

Figure 7A:
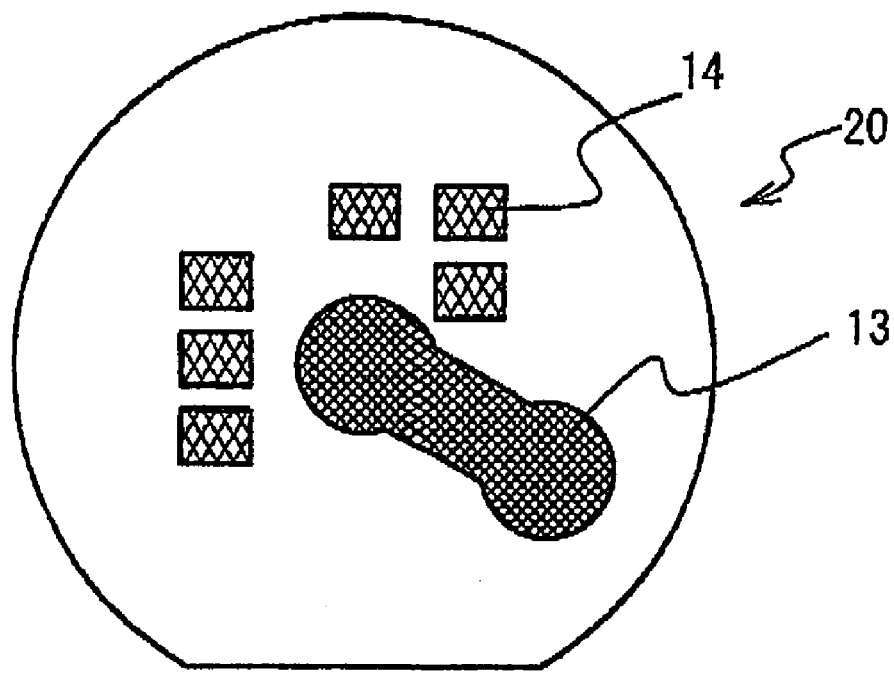
Figure 7B:
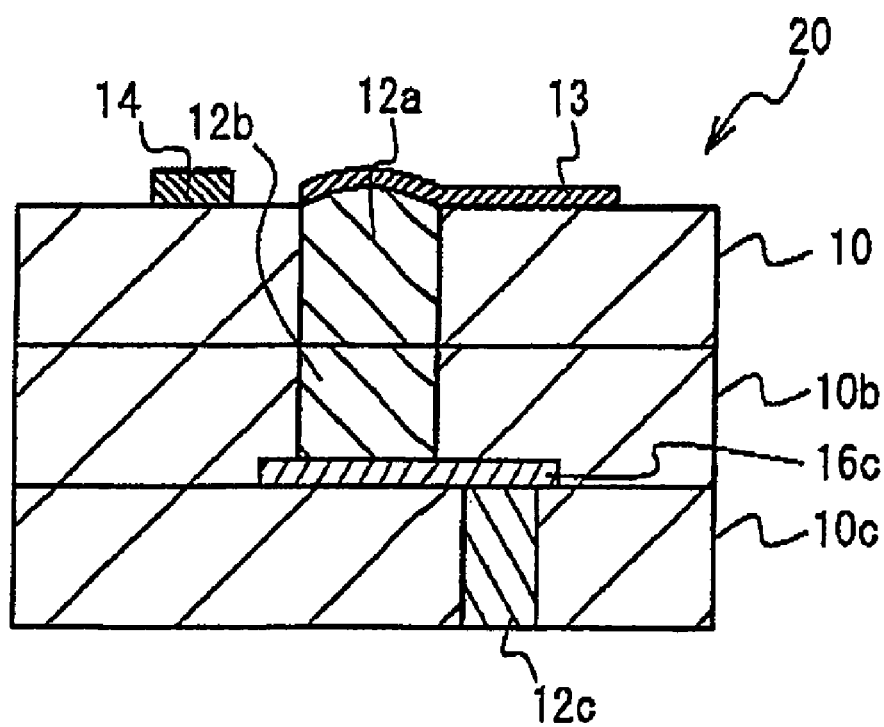

Referring to FIGS. 7A and 7B, a glass layer 14 is selectively formed on the surface of the uppermost green sheet 10a. The glass layer 14 is formed in an area in which a capacitor 40 (illustrated in FIG. 9D) should be formed in a later fabrication step. The glass layer 14 may be 5 µm to 6 µm thick, for example. The glass layer 14 may have a greater thickness equal to or greater than 10 µm. Then, the glass layer 14 may be baked at 800° C. to 900° C. together with the green sheets 10a through 10c. The upper surface of the through electrode 12a protrudes from the surface of the green sheet 10 due to stress in baking.

Figure 8A:
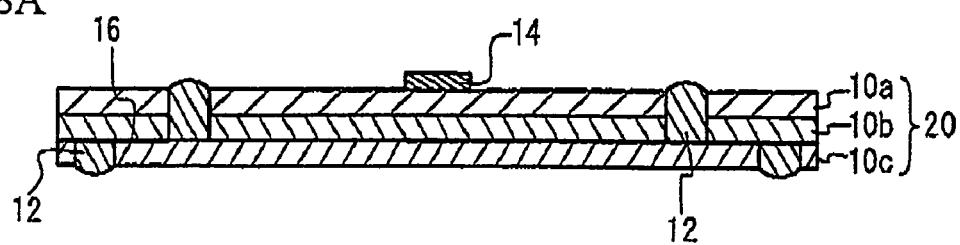
FIGS. 8A through 8E illustrate a first part of a method of fabricating an electronic device in accordance with the first embodiment.

FIGS. 8A through 9D are views illustrating a method of fabricating an IPD that is part of the electronic device in accordance with the first embodiment. FIG. 8A illustrates the ceramic multilayer substrate 20 in which baking of the glass layer 14 has been completed, and follows the step of FIGS. 7A and 7B. The through electrodes 12 and the inner interconnections 16 are formed in the ceramic substrate 20. The reference numeral 13 indicating the interconnection formed on the surface of the ceramic substrate 20 depicted in FIG. 7B is omitted in FIG. 8A for the sake of simplicity. Referring to FIG. 8B, plating layers 17 are formed on the surfaces of the through electrodes 12 in the ceramic substrate 20 by electroless plating. The plating layers 17 may be composed of a Ni film having a thickness of 1 µm to 3 µm and an Au film having a thickness of 0.1 µm to 3 µm. A Pd film that is 0.1 µm to 3 µm thick may be provided between the Ni film and the Au film.

The plating layers 17 function to protect the surfaces of the through electrodes 12 and prevent diffusion of metal.

Figure 8B:
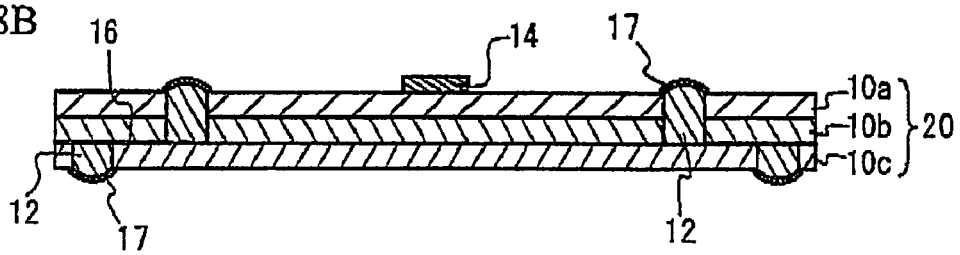
Figure 8C:
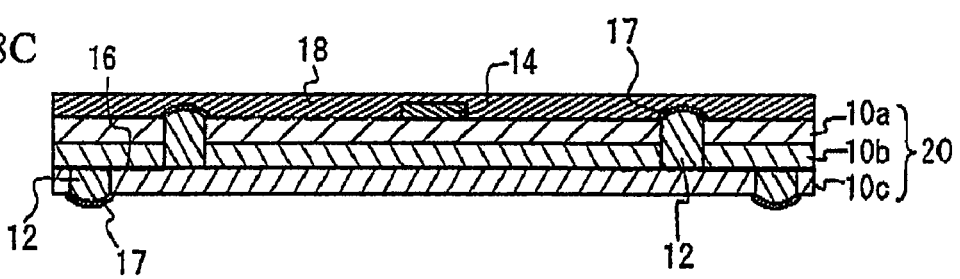

Referring to FIG. 8C, a metal layer 18 is formed on the surface of the ceramic substrate 20 by sputtering. Preferably, the metal layer 18 contains, as a major component, a metal having a relatively low resistance such as Al, Au or Cu. For example, the metal layer 18 may be Ti (20 nm)/Au (800 nm)/Ni (200 nm)/Au (20 nm) from the surface of the substrate. It is also possible to employ the metal layer 18 having a laminate of Ti (20 nm)/Cu (1000 nm)/Ti (20 nm), Ti (20 nm)/Cu (800 nm)/Ti (200 nm)/Au (20 nm), or Ti (20 nm)/Au (1000 nm)/Ti (20 nm). The metal layer 18 is formed on the surface of the glass layer 14, and becomes a lower electrode of a capacitor in a later fabrication step.

Figure 8D:
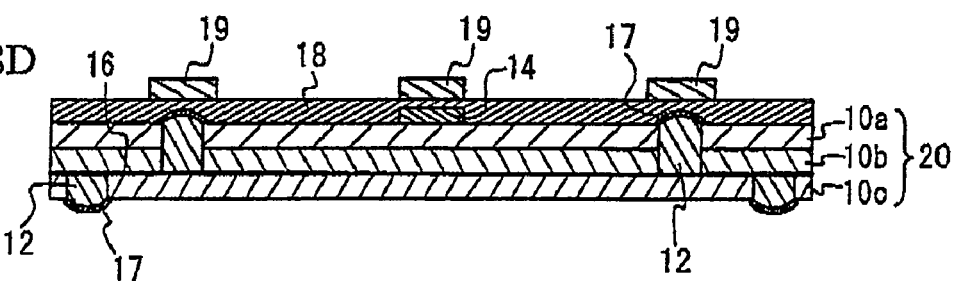

Referring to FIG. 8D, a photoresist 19 is provided on portions of the metal layer 18 that should be formed into the surface interconnections and the lower electrode of the capacitor. The photoresist 19 may, for example, be AZ6112 from AZ Electronics.

Figure 8E:
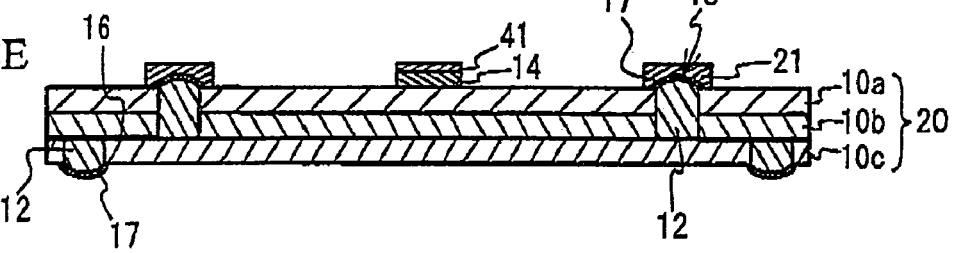

Referring to FIG. 8E, unwanted portions of the metal layer 18 are removed by milling, and the photoresist 19 is removed. By the steps of FIGS. 8C through 8E, surface interconnections 21 and a lower electrode 41 of a capacitor are formed. Alternatively, the surface interconnections 21 and the lower electrode 41 may be formed by evaporating the metal layer after the photoresist is formed and removing the unwanted portions of the metal layer together with the resist by liftoff.

Figure 9A:
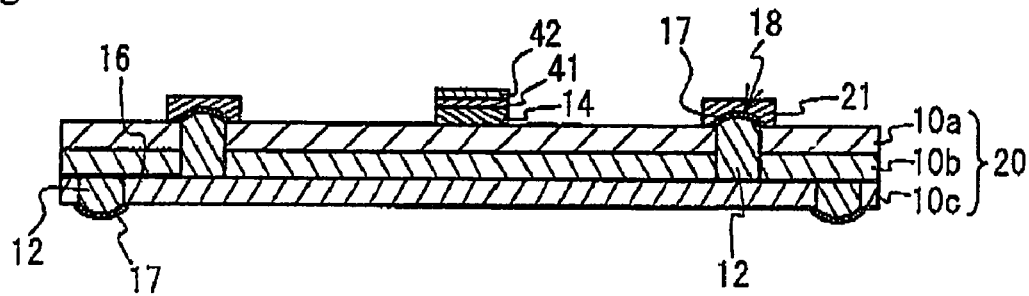
FIGS. 9A through 9D illustrate a second part of the method of fabricating the electronic device in accordance with the first embodiment.

Referring to FIG. 9A, a dielectric film 42 is formed on the lower electrode 41. The dielectric film 42 may be formed by sputtering or PECVD (Plasma Enhanced Chemical Vapor Deposition). For example, the dielectric film 42 may be 100 nm to 500 nm thick and may be made of $SiO_2$, $Si_3N_4$, $AlO_2$ or $Ta_2O_3$.

Figure 9B:
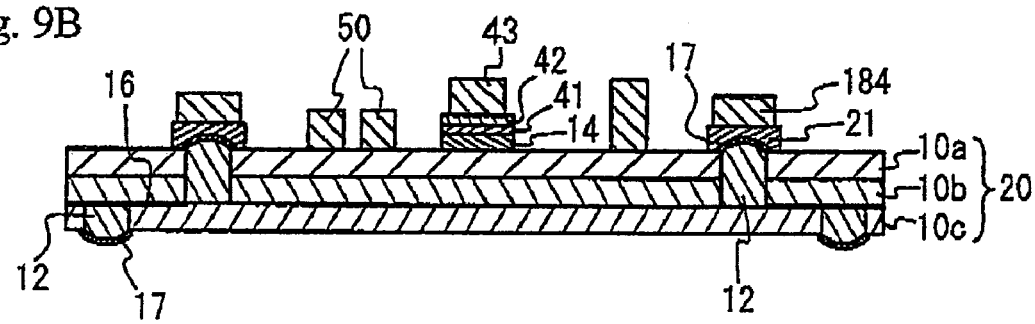

Referring to FIG. 9B, a seed layer (not illustrated) of a Ti/Au film or Ti/Cu film is formed on the surface of the ceramic substrate 20 in which the lower layer is made of Ti. A plating layer is formed in a give area on the seed layer. The plating layer may be made of Cu, and may be 3 to 15 µm thick. Then, the seed layer is removed with the plating layer being used as mask, so that an upper electrode 43, an inductor 50 and lower connection terminals can be formed from the plating layer. Thus, the capacitor 40 composed of the upper electrode 43, the dielectric film 42 and the lower electrode 41 is formed on the glass layer 14. That is, the capacitor 40 is an MIM type capacitor composed of the electrodes 41 and 43 and the dielectric film 42.

Figure 9C:
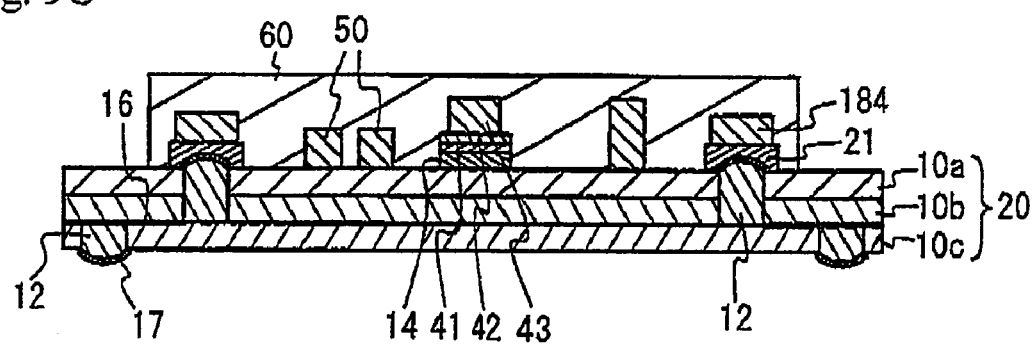

Referring to FIG. 9C, a low dielectric film 60 is formed on the ceramic substrate 20 so as to cover the upper electrode 43, the inductor 50 and lower connection terminals 184. The low dielectric film 60 may, for example, be PBO (Polybenzoxazole) or BCB (Benzocyclobutene).

Figure 9D:
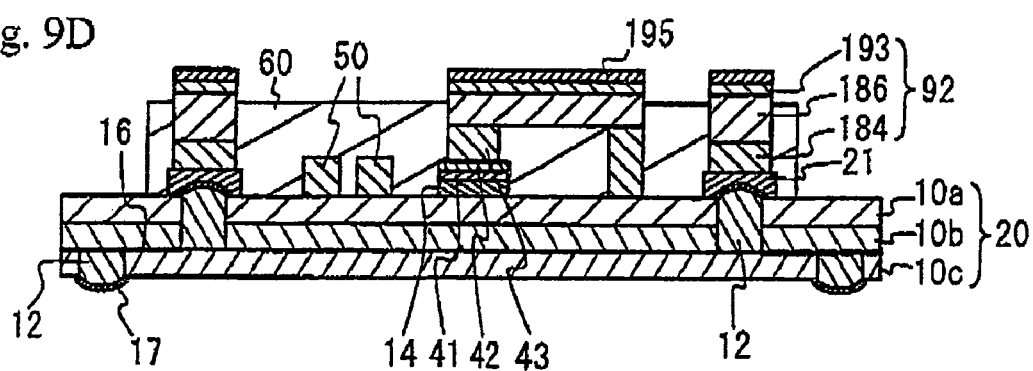

Referring to FIG. 9D, a given area of the low dielectric film 60 is removed so that the surfaces of the lower connection terminals 184 can be exposed. Then, by using electrolytic plating, upper connection terminals 186 are formed so as to contact the upper surfaces of the lower connection terminals 184. The upper connection terminals 186 may, for example, be 10 µm thick and made of Cu. A laminate of an Au film 193 and a Ni film 195 is formed on the upper surfaces of the upper connecting terminals 186. This laminate is used as a pad. A connecting terminal 92 composed of the lower connection terminal 184, the upper connection terminal 186, the Au film 193 and the Ni film 195 is formed on each through electrode 12. Thus, the IPD that is part of the electronic device in accordance with the first embodiment is completed.

Figure 10:
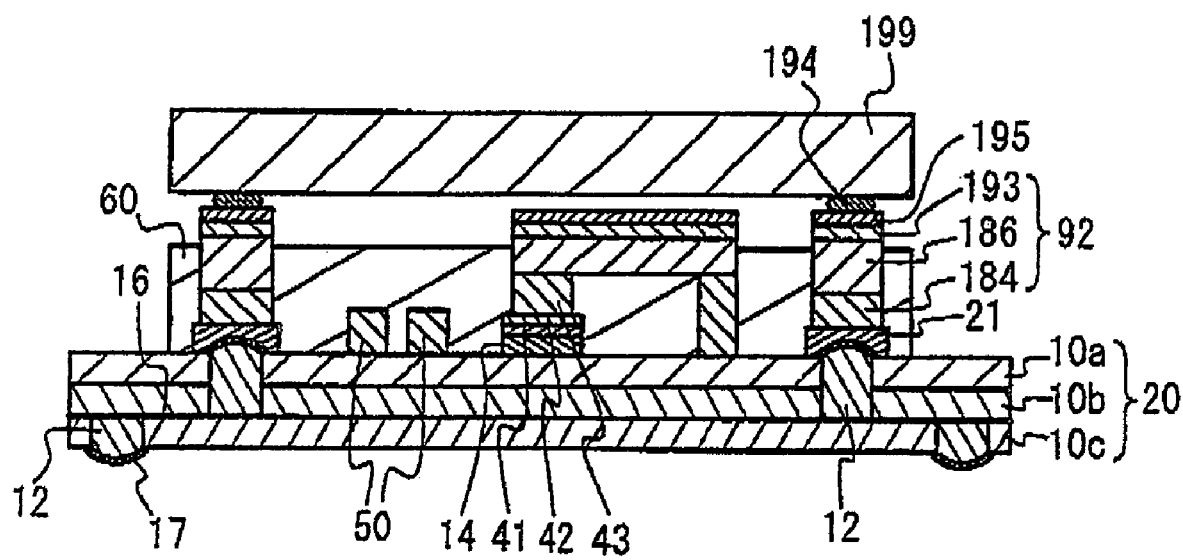
FIG. 10 is a cross-sectional view of the electronic device in accordance with the first embodiment.

Referring to FIG. 10, bumps 194 are formed on the surfaces of the connection terminals 92, and a chip 199 is flip-chip mounted on the IPD. The bumps 194 may be made of a metal such as solder or Au. The chip 199 may include, for example, a SAW (Surface Acoustic Wave) filter, an FBAR (Film Bulk Acoustic Resonator) filter, or an IC (Integrated Circuit). Thus, the electronic device of the first embodiment is completed.

In the electronic device of the first embodiment, the glass layer 14 is formed partially or selectively on the upper surface of the ceramic substrate 20, and the capacitor 40 is formed on the upper surface of the glass layer 14. The surface of the glass layer 14 is flat, as compared to the surface of the ceramic substrate 20. Thus, the adhesiveness to the lower electrode 41 of metal can be improved. Further, the flatness of the area in which the capacitor 40 is formed can be enhanced, so that short-circuiting between the lower electrode 41 and the upper electrode 43 can be restrained.

The conventional art in which the surface of the ceramic substrate is coated with SOG and a capacitor is formed thereon has difficulty in removing whole warpage and undulation of the ceramic substrate that take place at the time of baking. In contrast, according to the first embodiment, the glass layer 14 is selectively formed in the area in which the capacitor 40 should be formed. Thus, the glass layer 14 is not affected greatly by whole warpage of the ceramic substrate 20. This easily makes it possible to keep the surface of the glass layer 14 flat. As is known, SOG used in the conventional art is easily broken when the coating layer is thick. In contrast, according to the first embodiment, the glass layer 14 is formed in only the wanted area, so that the adhesiveness can easily be improved by using an increased thickness of the glass layer 14 equal to or greater than, for example, 10 μm. Conventionally, SOG is needed to cover the whole substrate. It is thus necessary to form an opening in the SOG film in order to form the through electrode by etching. However, etching may damage the surface of the ceramic substrate. In contrast, according to the first embodiment, the glass layer 14 may be formed in only the wanted areas by printing. Thus, the ceramic substrate 20 can be prevented from being damaged.

According to the first embodiment, it is possible to improve the adhesiveness between the ceramic substrate 20 and the capacitor 40 and to improve the flatness on the ceramic substrate 20 in the area in which the capacitor 40 should be formed. Thus, the reliability of the electronic device can be improved. The improvements in adhesiveness and flatness can be achieved without polishing the surface of the ceramic substrate 20, so that the production cost can be reduced.

Referring to FIGS. 7A and 7B, the glass layer 14 may be formed in an area other than the area in which the capacitor 40 should be formed. However, it is preferable that the glass layer 14 is not formed on the ceramic substrate 20 in an area in which the capacitor 40 is not to be formed. If the glass layer 14 is formed on the through electrodes 12, the later process needs a step of forming an opening by etching. It is thus preferable that the glass layer 14 is not formed on the through electrodes 12. Preferably, the glass layer 14 includes an oxide that is the major component of the ceramic substrate 20. It is thus possible to further improve the adhesiveness between the glass layer 14 and the lower electrode 41.

Referring to FIG. 8E, the lower electrode 41 of the capacitor 40 is formed on the upper surface of the glass layer 14. The lower electrode 41 may have an arbitrary size. However, it is preferable that the lower electrode 41 has a size equal to or smaller than that of the glass layer 14 in terms of adhesiveness. That is, there is no portion of the lower electrode 41 that extends beyond the glass layer 14. Preferably, the lower electrode 41 covers the whole surface of the glass layer 14. It is thus possible to further improve the adhesiveness between the glass layer 14 and the lower electrode 41.

As illustrated in FIGS. 5A and 5B, the first embodiment employs the ceramic multilayer substrate 20 composed of the stacked green sheets 10a through 10c. Instead, a ceramic single-layer substrate may be used. The ceramic single-layer substrate may easily be warped or undulated, as compared to the ceramic multilayer substrate. Thus, great advantages are obtained particularly for the ceramic single-layer substrate according to the first embodiment. The ceramic single-layer substrate may be employed for a second embodiment and variations described later.

The first embodiment described with reference to FIGS. 7A and 7B employs the process of baking the glass layer 14 together with the green sheets 10a through 10c. Alternatively, the glass layer 14 may be baked after the ceramic substrate 20 is baked. In this case, first baking is carried out after the shaping step of FIGS. 6A and 6B to form the baked ceramic substrate 20 from the green sheets 10a through 10c. Next, as illustrated in FIGS. 7A and 7B, the glass layer 14 is selectively formed on the surface of the ceramic substrate 20 by printing, and second baking is carried out. The temperature of the first baking may be equal to that of the simultaneous baking and may be 800° C. to 900° C. The second baking uses a temperature lower than that of the first baking and may be 600° C., for example.

In FIG. 8B, the first embodiment employs plating for forming the projection film on the surfaces of the through electrodes 12. The protection film may be formed by sputtering. Now, sputtering is described.

Figure 11A:
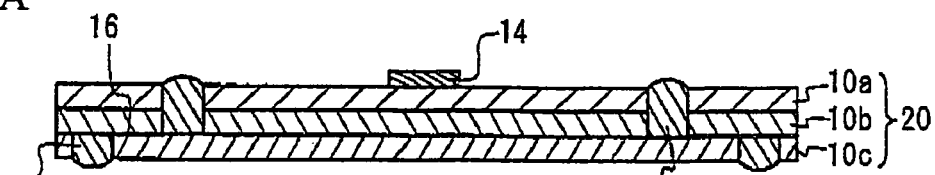
FIGS. 11A through 11F illustrate a method of fabricating an electronic device in accordance with a variation of the first embodiment.
Figure 11B:
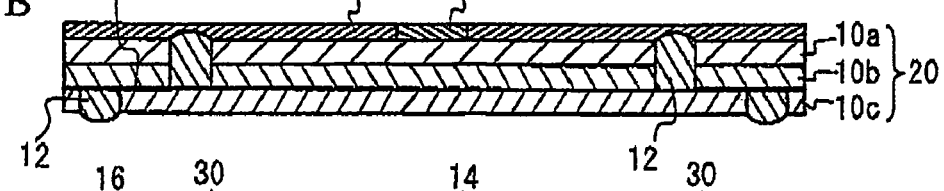

FIG. 11A illustrates the ceramic substrate 20 in which the glass layer 14 has been baked, and follows the step of FIGS. 7A and 7B like FIG. 8A. Referring to FIG. 11B, diffusion barrier layers 30 are formed on both surfaces of the ceramic substrate 20 by sputtering. The diffusion barrier layer 30 may be Ti (100-500 nm)/TiW (500-3000 nm) from the substrate surface, and may be Ti (100-500 nm)/TiW (300-2000 nm)/Cu (300-3000 nm), or Ti (100-500 nm)/Au (500-3000 nm).

Figure 11C:
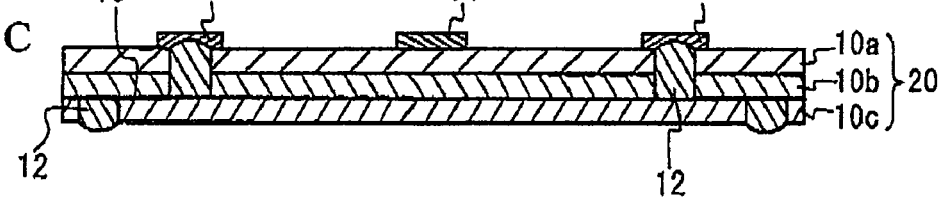

Referring to FIG. 11C, resist (not illustrated) is formed on the diffusion barrier layer 30, and unwanted portions of the diffusion barrier layer 30 are removed by milling. Then, the resist is removed. The photoresist 19 may, for example, be AZ6112 from AZ Electronics. Thus, the diffusion barrier layer 30 is selectively on the surfaces of the through electrodes 12.

Figure 11D:
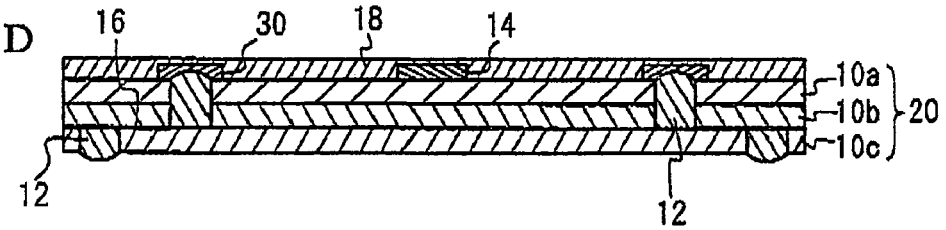
Figure 11E:
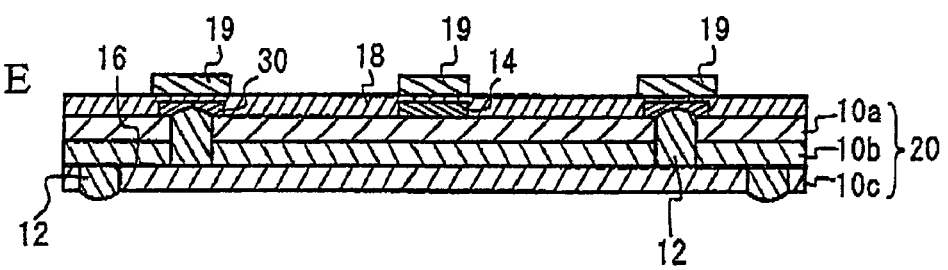
Figure 11F:
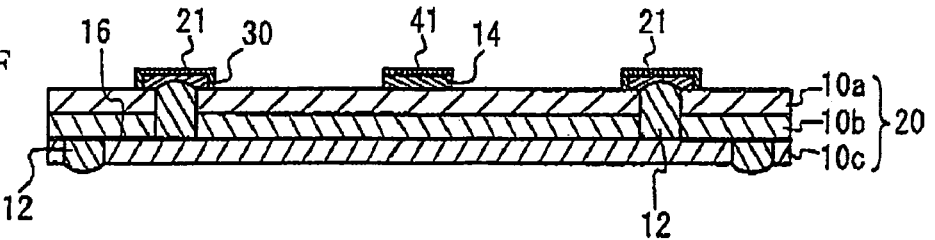

Referring to FIG. 11D, the metal layer 18 is formed on the upper surface of the ceramic substrate 20. Referring to FIG. 11E, the photoresist 19 is formed on the surface of the metal layer 18. Referring to FIG. 11F, unwanted portions of the metal layer 18 are removed by nulling. Thus, interconnections are formed on the surface of the ceramic substrate 20, and the lower electrode 41 of the capacitor 40 is formed on the upper surface of the glass layer 14. Subsequent steps are the same as those starting from the step of FIG. 9A. The steps of FIGS. 11D through 11F are the same as those of FIGS. 8C through 8E described before, and a detailed description thereof is omitted here. The protection film for protecting the through electrodes 12 may be formed by sputtering.

In the first embodiment illustrated in FIG. 10, the inductor 50, which is a passive element, is directly formed on the ceramic substrate 20. Another way is to form a dielectric film on the upper surface of the ceramic substrate 20 and form the inductor on the dielectric film. This dielectric film may be made of, for example, $SiO_2$, $Si_3N_4$, $TiO_2$ or $Ta_2O_5$. It is preferable that the thickness of the dielectric film is smaller than that of the glass layer 14 formed below the capacitor 40. For example, the dielectric film may be 100-500 nm thick.

Figure 12:
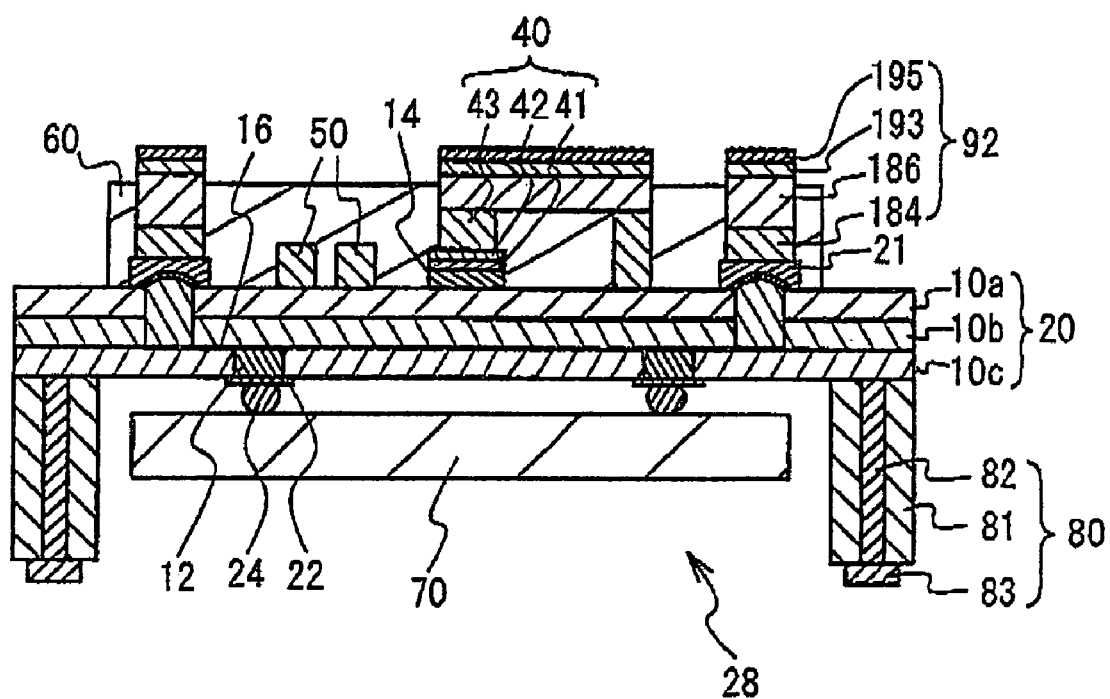
FIG. 12 is a cross-sectional view of an electronic device in accordance with the variation of the first embodiment.

In the first embodiment illustrated in FIG. 10, the lower surface of the ceramic substrate 20 is flat. FIG. 12 illustrates another arrangement in which a region for mounting an electronic element is defined on the lower surface of the ceramic substrate 20. As illustrated in FIG. 12, external connection terminals 22 are provided on the lower surface of the ceramic substrate 20. An electronic device 70 is attached to the external connection terminals 22 via connecting members 24 such as solder. A protrusion 80 is formed so as to surround the electronic device 70. The protrusion 80 includes an insulative cavity wall (insulative member) 81 made of, for example, ceramics, inner interconnections 82 and electrodes 83. The electrodes 83 are provided to an end of the cavity wall 81, and function to electrically connect the electronic device 70 to an external circuit or device. The cavity wall 81 may be formed integrally with the insulative substrate 10.

According to the structure in which the protrusion 80 is provided so as to protrude from the lower surface of the ceramic substrate 20, the electronic device 70 may be mounted in an opening 28 defined by the ceramic substrate 20 and the protrusion 80. Since the protrusion 80 has the electrodes 83 on the end, the electronic device of the first embodiment may be mounted on an interposer using the electrodes 83.

Second Embodiment

Figure 13:
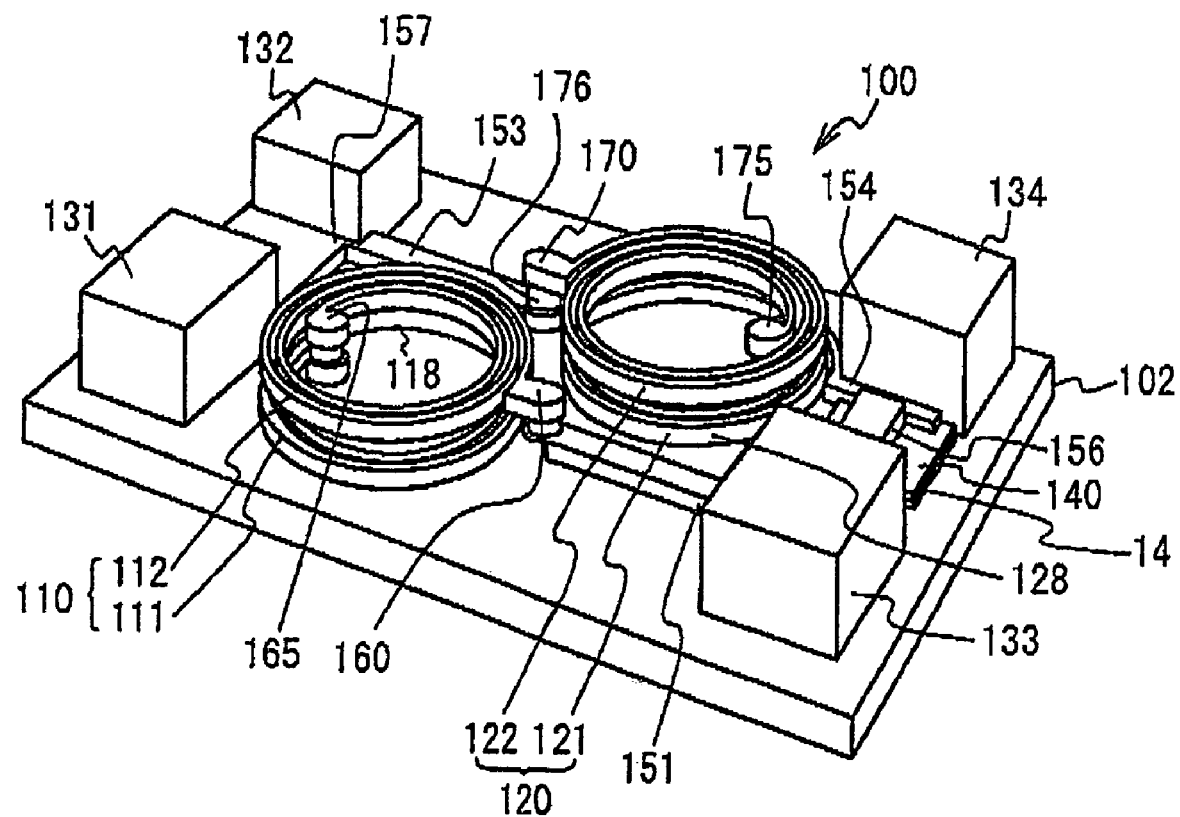
FIG. 13 is a perspective view of an integrated passive device in accordance with a second embodiment.
Figure 14:
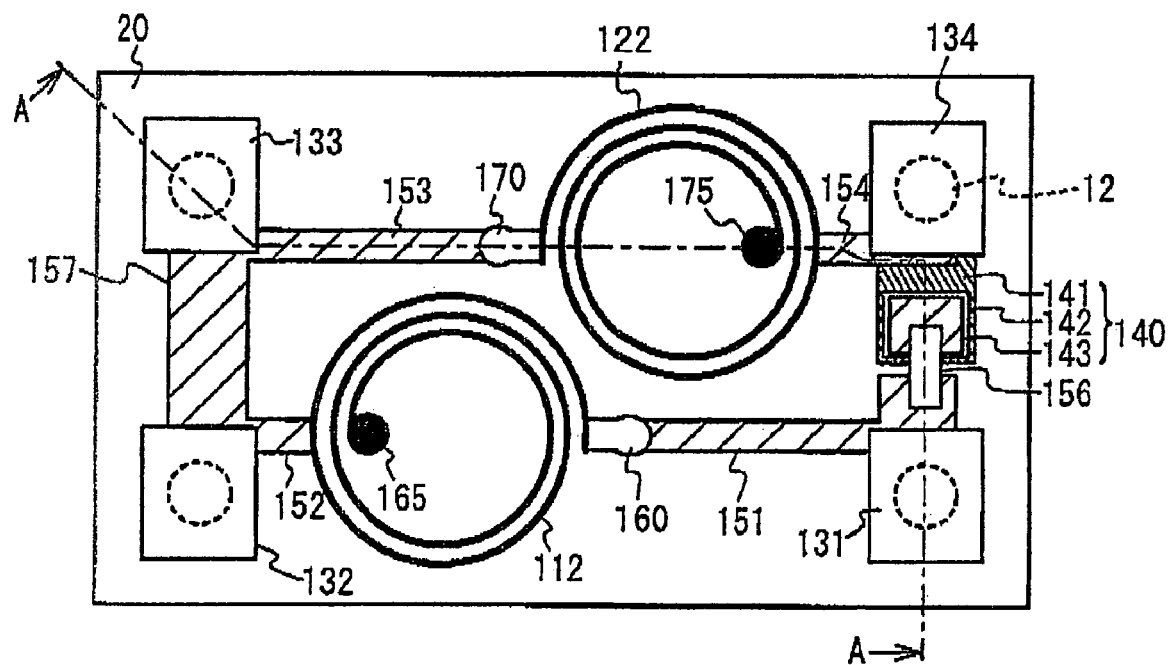
FIG. 14 is a top view of the integrated passive device in accordance with the second embodiment.
Figure 15:
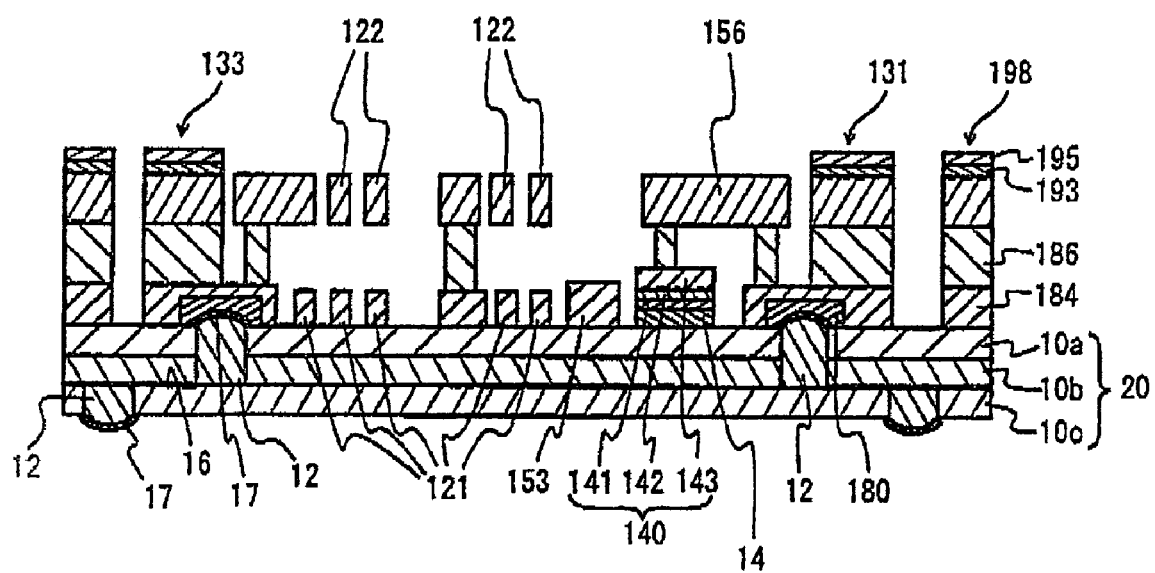
FIG. 15 is a cross-sectional view of the integrated passive device in accordance with the second embodiment.

A second embodiment has an exemplary electronic device in which a multi-stage inductor is employed as a passive element. FIG. 13 is a perspective view of an IPD 100 that is a part of the electronic device in accordance with the second embodiment, FIG. 14 is a top view of the IPD 100 (in which some coils are not illustrated for the sake of simplicity), and FIG. 15 is a cross-sectional view taken along a line A-A depicted in FIG. 14. Referring to these figures, inductors 110 and 120 are formed on the ceramic substrate 20. The inductor 110 is composed of a first coil 111 and a second coil 112, and the inductor 120 is composed of a first coil 121 and a second coil 122.

As illustrated in FIGS. 13 and 14, an inner end (innermost end) of the first coil 111 and that of the second coil 112 of the inductor 110 are electrically connected to each other by a connecting portion 165. An outer end (outermost end) of the first coil 111 is electrically connected to an interconnection 152, and an outer end of the second coil 112 is electrically connected to an interconnection 151 via a connecting portion 160. An inner end of the first coil 121 and an inner end of the second coil 122 of the inductor 120 are electrically connected to each other by a connecting portion 175. An outer end of the first coil 121 is electrically connected to an interconnection 154, and an outer end of the second coil 122 is connected to an interconnection 153 via a connecting portion 170.

The interconnections 151 through 154 are formed on the ceramic substrate 20, and are connected to connecting terminals 131 through 134, respectively. The connecting terminals 132 and 133 are connected together by an interconnection 157. A capacitor 140 is provided between the connecting terminals 131 and 134. The capacitor 140 is provide on the glass layer 14 partially formed on the ceramic substrate 20, and is composed of a lower electrode 141, a dielectric film 142 and an upper electrode 143.

The upper electrode 143 and the interconnection 151 are connected by an upper interconnection 156. The IPD 100 forms a π-type L-C-L circuit between the connecting terminals 131 and 134 by defining the connecting terminals 131 and 134 as input and output terminals, respectively and grounding the connecting terminals 132 and 133.

As illustrated in FIG. 13, the IPD 100 that is part of the electronic device of the second embodiment employs the multi-stage inductor composed of inductors 110 and 120 instead of the single-stage inductor 50 of the first embodiment (see FIG. 9D). It is thus possible to further improve the filter characteristic. As illustrated in FIG. 15, the IPD 100 of the second embodiment is equipped with the inductors 110 and 120 configured so that the first coils 111 and 121 having a spiral shape are formed on the ceramic substrate 20 on which the glass layer 14 is formed (see FIG. 8A), and the second coils 112 and 122 having a spiral shape are formed above the first coils 111 and 121 via gaps. Further, the capacitor and the various interconnections are formed on the ceramic substrate 20. The method described in Japanese Laid-Open Patent Publication No. 2007-67236 may be applied to the method of fabricating the second embodiment. Connecting terminal 198 illustrated in FIG. 15, which are not illustrated in FIGS. 13 and 14, are used to electrically connect the ceramic substrate 20 to an external circuit or device. The structure of the connecting terminals 198 are the same as that of the connecting terminal 92 of the first embodiment (see FIG. 9D) an those of the connecting terminals 131 through 134 of the second embodiment (see FIG. 15).

Figure 16:
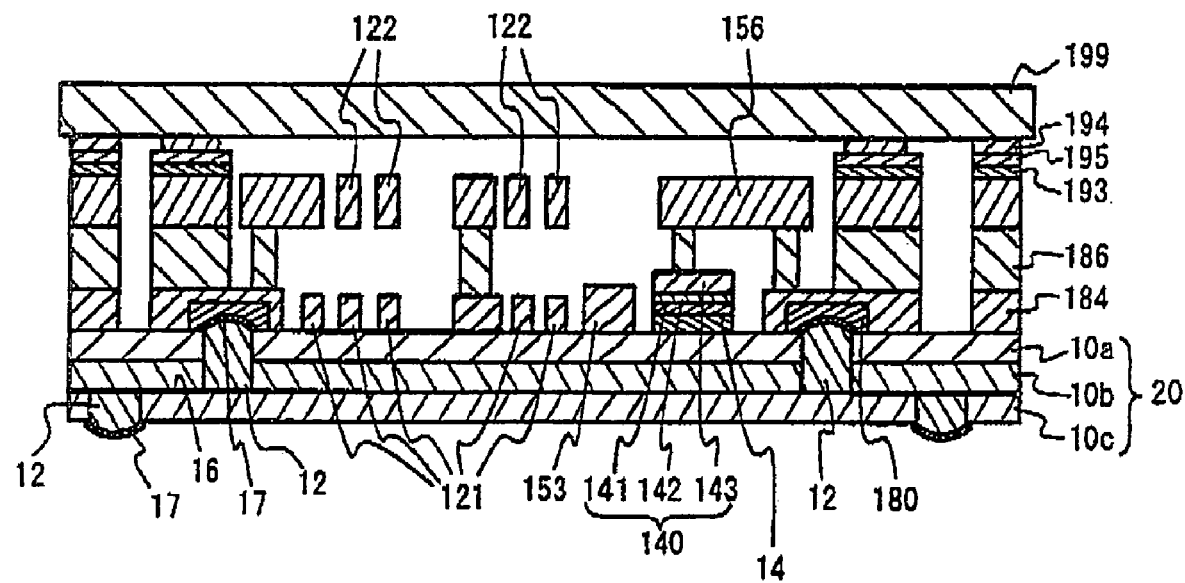
FIG. 16 is a cross-sectional view of an electronic device in accordance with the second embodiment.

FIG. 16 illustrates an electronic device in which the chip 199 is mounted on the IPD 100 of the second embodiment. As in the case of the first embodiment, the chip 199 is flip-chip mounted on the upper surfaces of the connecting terminals 131, 133 and 198 by bumps 194. The chip 199 may have a surface acoustic wave filter, FBAR filter or IC.

As illustrated in FIG. 16, in the electronic device of the second embodiment, the glass layer 14 is selectively formed on the surface of the ceramic substrate 20, and the capacitor 140 is formed on the glass layer 14. It is thus possible to improve the adhesiveness between the ceramic substrate 20 and the capacitor 140 in the electronic device equipped with the multi-stage inductor composed of the inductors 110 and 120. The second embodiment having the inductors 110 and 120 directly formed on the ceramic substrate 20 may be varied so that these inductors are formed on a dielectric film formed on the surface of the ceramic substrate 20 as in the case of the aforementioned variation of the first embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A method of fabricating an electronic device, comprising:
   selectively forming a glass layer on a substrate by printing;
   baking the glass layer; and
   forming a capacitor on the glass layer, the capacitor including metal electrodes and a dielectric layer interposed between the metal electrodes,
   wherein forming a capacitor includes:
      forming a lower electrode on an upper surface of the glass layer, the lower electrode being one of the metal electrodes;
      forming the dielectric layer on said one of the metal electrodes; and forming an upper electrode on the dielectric layer, the upper electrode being another one of the metal electrodes.

2. The method according to claim 1, wherein selectively forming a glass layer does not form the glass layer in an area on the ceramic substrate in which the capacitor is not formed.

3. The method according to claim 1, wherein tile ceramic substrate includes a through electrode, and selectively forming a glass layer does not form the glass layer on the through electrode.

4. The method according to claim 1, wherein forming a lower electrode includes forming the lower electrode so that the lower electrode and the glass layer have an identical width and length and form flat side surfaces of the capacitor.

5. The method as claimed in claim 1, further comprising baking the ceramic substrate, wherein baking the glass layer and baking the ceramic substrate are performed at the same time.

6. The method as claimed in claim 1, further comprising baking the ceramic substrate, wherein baking the ceramic substrate is performed before baking the glass layer.

7. The method as claimed in claim 1, wherein the ceramic substrate is formed of a ceramic multilayer substrate.

8. The method as claimed its claim 1, wherein the glass layer includes an oxide that is a major component of the ceramic substrate.

9. The method as claimed in claim 1, further comprising;
forming a first spiral coil on the ceramic substrate; and
forming a second spiral coil above the first spiral coil via a gap,
wherein the first spiral coil and the second spiral coil are formed in an area on the ceramic substrate in which the capacitor is not formed.

* * * * *